US005581192A

United States Patent [19]

Shea et al.

[11] Patent Number: 5,581,192

[45] Date of Patent: *Dec. 3, 1996

[54] CONDUCTIVE LIQUID COMPOSITIONS AND ELECTRICAL CIRCUIT PROTECTION DEVICES COMPRISING CONDUCTIVE LIQUID COMPOSITIONS

[75] Inventors: John J. Shea, Pittsburgh; James D. B. Smith, Monroeville; Karl F. Schoch, Jr., Pittsburgh, all of Pa.

[73] Assignee: Eaton Corporation, Cleveland, Ohio

[ * ] Notice: The term of this patent shall not extend beyond the expiration date of Pat. No. 5,471,185.

[21] Appl. No.: 350,299

[22] Filed: Dec. 6, 1994

[51] Int. Cl.[6] .......................... G01R 31/00; H01H 29/00

[52] U.S. Cl. .......................... 324/722; 324/555; 335/47; 335/51; 361/58

[58] Field of Search .................................. 337/114, 115, 337/118, 158, 21; 340/652, 653, 664; 324/722, 92, 93, 424, 537, 555; 335/47–58; 361/58

[56] References Cited

U.S. PATENT DOCUMENTS

| | | | |
|---|---|---|---|
| 3,644,860 | 2/1972 | Yamagata et al. | 337/21 |
| 3,753,190 | 8/1973 | Ito et al. | 337/21 |
| 3,845,264 | 10/1974 | Twyford | 200/214 |
| 3,991,396 | 11/1976 | Barkan | 337/114 |
| 4,349,282 | 9/1982 | Norfolk | 374/183 |
| 4,358,641 | 11/1982 | Proud et al. | 340/396.1 |
| 5,471,185 | 11/1995 | Shea et al. | 335/51 |

OTHER PUBLICATIONS

Yoshino, K., Novel Electrical and Optical Properties of Liquid Conducting Polymers and Oligomers, IEEE Transactions on Dielectrics and Electrical Insulation, vol. 1, No. 3, Jun. 1994, pp. 353–364.

*Primary Examiner*—Kenneth A. Wieder
*Assistant Examiner*—Diep Do
*Attorney, Agent, or Firm*—Martin J. Moran

[57] ABSTRACT

Novel conductive liquid compositions which have low resistivity when carrying an applied steady-state current ($I_{Steady\text{-}State}$) but exhibit sharp increases in resistivity when subject to an applied fault current ($I_{Fault}$). When used in circuit protection devices, the novel conductive liquid compositions having low resistivity are contained within an elongated flexible tube sealed by electrodes electrically connected to a load of an electrical circuit. The conductive liquid compositions carry an applied normal current under steady-state conditions. The flexible tube is deformed by radial contraction transverse to the direction of current flow and axial expansion, when an excessive current of fault magnitude is sensed by an actuator electrically connected to the electrodes and mechanically connected to the flexible tube to apply a deformation force on the tube, thereby causing the current path of the conductive liquid compositions to have high resistivity in order to limit the let through current to a safe value ($I_{Limited}$). When the excessive current is removed, the deformation is correspondingly removed and the conductive liquid composition automatically reverts back to its original low resistivity state. The invention has specific applications as automatically resettable fuses or current limiters.

31 Claims, 5 Drawing Sheets

CONDUCTIVE LIQUID COMPOSITIONS AND ELECTRICAL CIRCUIT PROTECTION DEVICES COMPRISING CONDUCTIVE LIQUID COMPOSITIONS

FIELD OF THE INVENTION

The invention generally relates to the field of electrical circuit protection devices, and in particular to electrical circuit protection devices comprising conductive liquid devices containing conductive liquid compositions. The invention further relates to conductive liquid compositions which exhibit characteristics such as sharp increases in resistivity upon constriction of the conductive path and to electrical circuit protection devices which comprise conductive liquid compositions. The invention has specific applications as automatically resettable fuses or current limiters. The invention is preferably used to limit a current at 600 Volts or lower, i.e. , low voltage applications.

When used as a circuit protection device, a conductive liquid composition having a low resistivity is contained within an elongated flexible capsule closed by electrodes, and the conductive liquid carries a normal current under steady-state conditions. When the current excessively increases due to overload or short circuit, i.e., a fault current, the conductive liquid composition within the compressible capsule is subjected to an external compressive force transverse to the direction of current flow through the conductive liquid composition which in turn reduces the cross-sectional area of the conductive liquid composition and constricts the current path therein, thereby sharply increasing the resistivity of the conductive liquid composition and limiting the let through current to a safe value. When the excessive current is removed, the compressive force is correspondingly removed and the conductive liquid composition automatically reverts back to its original low resistivity state.

BACKGROUND OF THE INVENTION

Current limiting power interruption requires a current interruption device that rapidly and effectively brings the current to a low or zero value upon the occurrence of a line fault or overload conditions.

Circuit protection devices protect electrical equipment from damage when excess current flows in the circuit due to overload or short circuit conditions. Such devices have a relatively low resistivity and, accordingly, high conductivity under normal current conditions of the circuit but are "tripped" or convened to high or complete resistivity when excessive current and/or temperature occurs. When the device is tripped, a reduced or zero current is allowed to pass in the circuit, thereby protecting the wires and load from electrical and thermal damage until the overload or fault is removed.

Conventional circuit protection or current limiting devices include, but are not limited to, circuit breakers, fuses, e.g., expulsion fuses, thermistors, e.g., PTC (Positive Temperature Coefficient) conductive polymer thermistors, and the like. These devices are current rated for the maximum current the device can carry without interruption under a load.

Circuit breakers typically contain a load sensing element, e.g., a bimetal, hot-wire, or magnetic element, and a switch which opens under overload or short circuit conditions. Most circuit breakers have to be reset manually at the breaker site or via a remote switch.

Fuses typically contain a load sensing fusible element, e.g., metal wire, which when exposed to current of fault magnitude rapidly melts and vaporizes through resistive heating ($I^2R$). Formation of an arc in the fuse, in series with the load, can introduce arc resistance into the circuit to reduce the peak let-through current to a value significantly lower than the fault current. Expulsion fuses may further contain gas-evolving or arc-quenching materials which rapidly quench the arc upon fusing to eliminate current conduction. Fuses generally are not reusable and must be replaced after overload or short circuit conditions because they are damaged inherently, when the circuit opens.

Various fusible elements, gas-evolving materials and fuses are shown for example in U.S. Pat. Nos. 2,526,448; 3,242,291; 3,582,586; 3,761,660; 3,925,745; 4,008,452; 4,035,755; 4,099,153; 4,166,266; 4,167,723; 4,179,677; 4,251,699; 4,307,368; 4,309,684; 4,319,212; 4,339,742; 4,340,790; 4,444,671; 4,520,337; 4,625,195; 4,638,283; 4,778,958; 4,808,963; 4,950,852; 4,952,900; 4,975,551; and, 4,995,886.

The resistance of a circuit element such as a fuse is a matter of its material and its dimensions. Resistance along the circuit path decreases with increasing cross-sectional area. Thus resistive heating of the circuit element, which is a function of current and resistance according to $I^2R$, is a function of current density. In a typical fuse, the fusible element has a small cross-sectional area along the direction of current flow, so as to concentrate heating at the fusible element, and comprises a low melting temperature material.

Thermistors are a particularly useful type of circuit protection devices that employ heating, especially positive temperature coefficient (PTC) conductive polymer thermistors. PTC conductive polymers typically comprise a polymer, e.g., a thermoplastic, thermoset, or elastomeric polymer, having conductive particles, e.g., carbon black, graphite, metal, or metal oxide, dispersed in the polymer matrix. PTC conductive polymers have low resistivity under normal current conditions, but due to the positive temperature coefficient of their resistance, undergo an exponential increase in resistivity as their temperature rises through resistive heating ($I^2R$) caused by fault current. The resistance becomes substantial over a particular current and/or temperature value which is referred to as the switching temperature or anomaly temperature. PTC conductive polymers can be placed in series with a load, thereby introducing increased resistance into the circuit to reduce the peak let through current to a value significantly lower than the fault current.

Once the fault current dissipates, the PTC conductive polymer material cools and reverts back to its original low resistivity. Accordingly the PTC conductive polymer is automatically resettable over a number of thermal cycles to provide a reusable circuit protection device. However, PTC conductive polymer devices are subject to degradation as a result of material resistivity changes over thermal cycles.

Various PTC conductive polymers and thermistors are shown for example in U.S. Pat. Nos. 2,952,761; 2,978,665; 3,243,753; 3,351,882; 3,571,777; 3,757,086; 3,793,716; 3,823,217; 3,858,144; 3,861,029; 3,950,604; 4,017,715; 4,072,848; 4,085,286; 4,117,312; 4,177,376; 4,177,446; 4,188,276; 4,237,441; 4,242,573; 4,545,926; 4,647,894; 4,685,025; 4,724,417; 4,774,024; 4,775,778; 4,857,880; 4,910,389; 5,049,850; and, 5,195,013.

What is needed is an improved automatically resettable electrical circuit protection device with improved circuit interrupting capacity and longer life.

SUMMARY OF THE INVENTION

It is an object of the invention to provide an electrically conductive liquid composition arranged in a circuit protection device.

It is also an object of the invention to provide an electrically conductive liquid composition having low resistivity (high conductivity) under normal current conditions, and which can be arranged in an elongated flexible capsule closed by electrodes to carry a normal current and which further can be constricted to a small cross-section transverse to the direction of the current path through the liquid, e.g. , by compressing the flexible capsule containing the conductive liquid, to obtain high resistivity (low conductivity) upon the introduction into the conductive path of an excessive current.

It is another object of the invention to provide electrical circuit protection devices containing conductive liquid compositions preferably arranged in a compressible capsule between electrodes which arrangement introduces high resistance into the circuit when subjected to a fault current through compression of the capsule and constriction of the current path through the conductive liquid.

It is a further object of the invention to provide automatically resettable electrical circuit protection devices with long life over a plurality of fault current cycles.

This invention provides novel conductive liquid compositions, e.g., conductive particle dispersions, conductive ionic solutions, conductive polymer solutions, and conductive liquid metals, in a novel arrangement and novel electrical circuit protection devices comprising conductive liquid compositions which have many technical advantages over the current state of the art. The conductive liquid compositions are contained within a compressible, preferably resilient and flexible capsule or hollow shell, e.g. , an elastomeric capsule, which is sealed by electrodes, e.g., copper, nickel, aluminum, silver, platinum, tungsten, or the like. The electrodes are in intimate contact with the conductive liquid compositions in the capsule, and electrically connect the conductive liquid composition to the electrical circuit, so as to conduct current between the electrodes through the conductive liquid. Means are provided controllably to compress the capsule upon introduction of a fault current, thereby constricting the cross-sectional area of the current path between the electrodes. The reduction of cross-sectional area, and possibly the heating with increased current density in the constricted area, are such that the resistance between the electrodes increases sharply as the compressive pressure exerted on the capsule containing a conductive liquid composition rises above a particular value, herein referred to as the switching pressure, and correspondingly, as the cross-sectional area of the conductive liquid composition within the capsule lowers below a particular value, herein referred to as the switching cross-sectional area.

As used in an electrical circuit protection device, the conductive liquid compositions have relatively low resistance under normal steady-state current conditions, but are tripped, i.e., converted into high resistivity when a fault condition occurs such as an overload or short circuit. When the device is tripped by excessive current, the current passing through the device causes an actuator, e.g. , a solenoid and plunger, which detects the excessive current to exert a compressive or deformation force on the conductive liquid composition in the capsule, thereby reducing the cross-sectional area of the liquid and constricting the current path which results in a high resistance state. The current is then preferably commutated, e.g. , by either constriction alone or together with a switch, to a shunt resistor, e.g., a metal rod or wire of nichrome, iron, nickel or the like, to limit the let through current to a safe value. Once the fault current is removed, the capsule distortion is removed and the conductive liquid automatically reverts back to its low resistance state, thereby providing an automatically resettable circuit protection device. Other specific structures for effecting reduction of the cross-sectional area of the current path are also possible.

The electrical circuit protection device of the invention can be used alone in an electrical circuit to create current limiting capability. The device of the invention can also be used in an electrical circuit in conjunction with a conventional circuit breaker device to create or enhance current limiting capability of the circuit breaker. Other applications will become apparent from this disclosure or from the practice of the invention.

The invention resides in encapsulated and electrically connectable conductive liquid compositions characterized by: (A) a flexible and resilient capsule, preferably an elongated elastomeric capsule, having two ends with electrodes, preferably metal or alloy electrodes; and, (B) a quantity of conductive liquid composition, for example, conductive particle dispersions, conductive ionic solutions, conductive polymer solutions, and conductive liquid metals, contained within the capsule and electrically connected to each of the electrodes. The quantity of electrically conductive liquid is switched in conductivity or resistance between the electrodes when subjected to an effective amount of constriction of the capsule transverse to the flow of electrical current between the electrodes. The resistance is increased by the decrease in cross-sectional area at the constriction, and possibly also by some positive temperature coefficient heating of the conductive liquid composition enhanced by the increased current density at the constriction.

The preferred conductive particle dispersions are characterized by: (A) a dielectric fluid selected from the group consisting of silicone oil, hydrocarbon oil, mineral oil, transformer oil, and ester oil; and, (B) a plurality of conductive particles selected from the group consisting of carbon black, graphite, metal, metal oxide, and metal coated particles, dispersed in the dielectric fluid.

The preferred conductive ionic solutions are characterized by: (A) a polar solvent selected from the group consisting of water, dioxane, tetrahydrofuran, ethanol, methanol, isopropanol, butyl alcohol, ethyl acetate, butyl acetate, acetonitrile, 2-ethyl-1-hexanol, glycerol, acetic acid, butyric acid, butyrulactone, ethylene carbonate, butyl phosphate, 2-pyrrolidinone, ethyl acetoacetate, dimethyl sulfoxide, and tetramethylene sulfone; and, (B) an organometallic salt selected from the group consisting of tetraphenyl phosphonium chloride, tetraphenyl phosphonium bromide, tetrabutyl arsonium chloride, triphenylbutyl arsonium iodide, methyltrioctyl phosphonium dimethylphosphate, tetrabutyl phosphonium acetate, tetraphenyl arsonium acetate, tetrabutyl ammonium chloride, benzylmethyl ammonium iodide, tetraphenyl stibonium bromide, tetraphenyl sodium boride, and hexafluoro lithium phosphate, dissociated in the solvent.

The preferred conductive polymer solutions are characterized by: (A) a polar solvent selected from the group consisting of water, dioxane, tetrahydrofuran, ethanol, methanol, isopropanol, butyl alcohol, ethyl acetate, butyl acetate, acetonitrile, 2-ethyl-1-hexanol, glycerol, acetic acid, butyric acid, butyralactone, ethylene carbonate, butyl phosphate, 2-pyrrolidinone, ethyl acetoacetate, dimethyl sulfoxide, and tetramethylene sulfone; and, (B) a conducting polymer or oligomer selected from the group consisting of poly (pyrroles), poly (anilines), poly (thiophenes), poly (-p-phenylene vinylenes), poly (3-alkyl thiophenes), poly (3-alkyl furans), poly (3-alkylselenophenes), poly (9-alkyl fluorenes), and poly (2,5-dialkoxy-p-phenylene vinylenes), dissolved in the solvent.

The preferred conductive liquid metal is characterized by liquid mercury. In addition a combination any of these conductive liquid compositions and combinations of any of the constituent components thereof can be performed to provide the conductive liquid compositions.

The invention also resides in an electrical circuit protection device or current limiter which is characterized by: (A) a flexible and preferably elongated resilient capsule, which can be cylindrically shaped and preferably is removable, having a length and two ends; (B) a conductive liquid composition contained within the flexible capsule between the two ends, which exhibits a switching from conductivity to resistivity when subject to an effective amount of constriction transverse to the length of the flexible capsule and to the direction of an electrical current applied to the conductive liquid; (C) two electrodes sealing the two ends of the flexible capsule, electrically connected to the conductive liquid composition for electrical connection along a conductor of electrical power to cause a current to pass through the conductive liquid composition between the electrodes; (D) a shunt resistor electrically connected to the electrodes; (E) an actuator preferably a solenoid and plunger combination electrically connected to the electrodes and mechanically connected to the capsule, in which the actuator when subject to fault current distorts the capsule by transverse constriction and axial expansion between the electrodes, whereby the conductive liquid is effective for varying the resistance between the electrodes; and, (F) means for commutating the current to the shunt resistor to limit the let-through current to an effectively safe value. The circuit protection device can also be connected to a conventional circuit breaker.

BRIEF DESCRIPTION OF THE DRAWINGS

There are shown in the drawings certain exemplary embodiments of the invention as presently preferred. It should be understood that the invention is not limited to the embodiments disclosed as examples, and is capable of variation within the scope of the appended claims. In the drawings.

DETAILED DESCRIPTION OF THE PREFERRED EMBODIMENTS OF THE INVENTION

Figure 1:
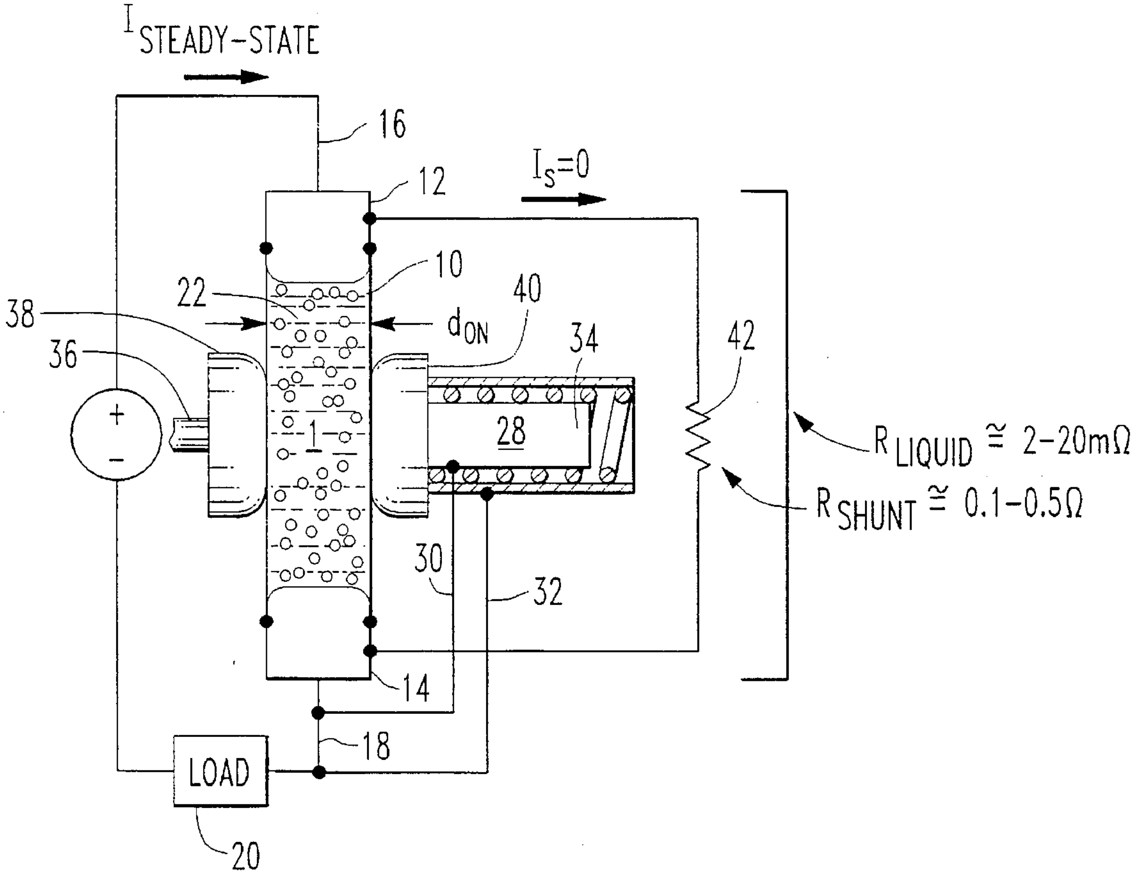
FIG. 1 is an illustration of an electrical circuit including an electrical power source, a load, and a solenoid, and further comprising a circuit protection device of the invention comprising conductive liquid compositions of the invention carrying a current under normal steady-state conditions.

The novel conductive liquid compositions of the invention when contained in a novel arrangement within a compressible and resilient, i.e., flexible, generally elongated capsule, e.g. , an elastomeric capsule, and when used as a electrical circuit component, the conductive liquid compositions have relatively low resistivity and readily carry a normal steady-state current. But in the event of excessive current increases, i.e., fault currents, the conductive liquid compositions contained within the capsule are compressed in a direction generally transverse to the current flow by an actuator connected to a load sensing element, e.g., a solenoid and plunger, which senses the magnitude of the current and produces a mechanical force in response to input electrical signals, producing distortion of the capsule, i.e., radial contraction and/or axial expansion. The distortion of the capsule, thereby reduces the cross-sectional area of the conductive liquid carrying the current, and, consequently, causes the conductive path through the conductive liquid between the electrodes and consequently the conductive liquid composition to have high resistivity. The resistance through the conductive liquid between the electrodes is increased by the decrease in the cross-sectional area at the constriction, and also possibly by positive temperature coefficient heating enhanced by increased current density at the constriction. The high resistivity of the conductive liquid compositions in this reduced cross-sectional area state limits the let through current either alone or preferably in conjunction with a shunt resistor to a safe value until the excessive current or power is removed. When the excessive current or power is removed, the distortion force is released and the encapsulated conductive liquids revert back to their original low resistance state for carrying normal current. Variations in the current input will produce corresponding variations in the degree of capsule distortion. This invention has specific application as an automatically resettable fuse or current limiter.

The electrical circuit protection or current limiting devices of this invention comprise the conductive liquids of the invention contained within a flexible capsule. The devices can rapidly and effectively interrupt fault currents when used as a circuit component, thereby protecting other circuit components, e.g., wires and load, from damage. Unlike conventional current limiters, the device of the invention does not generate a significant arc and, therefore, does not have to be replaced after fault. The device of the invention automatically and readily returns to its original low resistance state after fault and is reusable and long lasting over a number of fault cycles. The device of the invention operates on the magnitude of the current, and is therefore substantially unaffected by environmental conditions such as temperature, humidity, shock and vibrations unlike conventional current limiters.

The conductive liquid compositions of the invention that are preferably flexibly and conductively encapsulated are selected for their low resistivity (high conductivity) under normal steady-state current conditions and also for exhibiting a sharp increase in resistivity as the cross-sectional area of the flexibly encapsulated conductive liquid and accordingly as the cross-sectional area of the current path through the liquids is correspondingly reduced. The conductive liquid compositions may optionally be selected for positive temperature resistance properties initiated by resistive heating from increased current density in the area of constriction.

The conductive liquid compositions can be selected from the group of: (1) conductive particle dispersions (or, in other words, suspensions), preferably colloidal suspensions; (2) conductive ionic solutions, either anionic or cationic; (3) conductive polymer solutions; and, (4) conductive liquid metals. The conductive liquid compositions can also be a combination of any of the above described solutions.

The conductive liquid compositions can be made from conductive particle dispersions which are comprised of a dielectrically stable fluid having a plurality of conductive particles dispersed or suspended in the fluid. The conductive particles are preferably provided in the liquid suspension medium such that they do not have a tendency to settle out, remaining uniformly dispersed in the fluid medium. It is further preferred that the conductive particles be of a particle size to maintain the dispersion as a colloidal suspension of conductive particles. Moreover, in order to maintain a uniform dispersion or colloidal suspension of the conductive particles, any commonly used surfactant can be also included in the mixture. It is also preferred that the dielectric fluid used as the liquid suspension medium for the conductive particles is preferably preconditioned by applying a voltage across the fluid to break down the dielectric around the electrodes and/or the conductive particles, thereby allowing permanent conductance across the fluid.

The liquid medium of the conductive particles dispersions can comprise dielectric liquids of, for example, silicone oils, hydrocarbon oils, ester oils and the like, or mixtures thereof. Specific examples of dielectric silicone oils can include those based on silicone or siloxane polymers, such as methyl silicone polymers, methylphenyl silicone polymers, chlorophenylmethyl silicone polymers, polydimethyl siloxane polymers or copolymers thereof and the like. Specific examples of dielectric hydrocarbon oils can include those based on aliphatic, alicyclic and aromatic compounds, such as mineral oils or transformer oils and the like.

The conductive particles dispersed in the dielectric liquid suspension medium are selected from the group consisting of metal particles such as aluminum, copper, silver, and nickel particles, metal coated glass beads, metal coated mica flakes, metal coated fibers graphite particles, carbon black particles, metal oxide particles and the like. The metal coated hollow particles, such as metal coated glass beads, are especially preferred since they readily float in solution. The conductive particles preferably have a particle size of about 1 to 30 microns, preferably about 10 to 20 microns and can take on a variety of particle shapes such as spheres, flake, fiber, dendritic, popcorn, etc. The conductive particles are loaded in the liquid medium in an amount of about 10 to 40% (by volume), preferably about 10 to 25% (by volume). A colloidal suspension of conductive particles is especially preferred.

The conductive liquid compositions can also be made from conductive ionic or electrolyte solutions which are comprised of salts, preferably organometallic salts, most preferably quaternary organometallic salts, dissociated into ions in a polar solvent in order to act as an electrically conductive solution. Conductive particle filled systems are advantageous in that they are highly conductive but have certain drawbacks due to the tendency to separate out of solution which is disadvantageous for long term conductive liquid stability. On the other hand, conductive ionic solutions contain no conductive particles to separate out of solution and are, accordingly, homogeneous and stable solutions.

The organometallic ionic salts can be selected from the group of tetraphenyl phosphonium chloride, tetraphenyl phosphonium bromide, tetrabutyl arsonium chloride, triphenylbutyl arsonium iodide, methyltrioctyl phosphonium dimethylphosphate, tetrabutyl phosphonium acetate, tetraphenyl arsonium acetate, tetrabutyl ammonium chloride, benzylmethyl ammonium iodide, tetraphenyl stibonium bromide, tetraphenyl sodium boride, lithium hexafluoro phosphate and the like. These salts are preferably highly dissolved or dissociated in the liquid medium.

The liquid medium can be selected from solvents, preferably polar solvents of the group of water, dioxane, tetrahydrofuran (THF), ethanol, methanol, isopropanol, butyl alcohol, ethyl acetate, butyl acetate, acetonitrile, 2-ethyl-1-hexanol, glycerol, acetic acid, butyric acid, butyralactone, ethylene carbonate, butyl phosphate, 2-pyrrolidinone, ethyl acetoacetate, dimethyl sulfoxide (DMSO), tetramethylene sulfone and the like. The ionic solutions can also optionally include conductive particles as previously described.

The salts are typically provided in the solution at a concentration of about 2 to 70% (by weight), preferably about 20 to 40% (by weight), and most preferably at as high a concentration as possible to effectively provide the desired electrical conductance without crystallization out of the solution.

The conductive liquid compositions can also be made from conducting polymers or oligomers, either in the liquid state or solubilized in a solvent, such as a polar solvent. Liquid conducting polymers or oligomers are also described in Yoshino, K., *Novel Hectrical and Optical Properties of Liquid Conducting Polymers and Oligomers*, IEEE Trans. on Dielec. and Elec. Ins., Vol. 1, No. 3, pp. 353–364, June 1994, this disclosure being incorporated by reference herein in its entirety. Typically, the conducting polymers or oligomers have highly extended conjugated bonds in its backbone and are modified with long side chains, such as alkyl side chains, as substituents, which alter the properties of the conducting polymers or oligomers to being soluble (or changed to liquid) and also fusible.

Specific examples of electrically conducting polymers are poly (pyrroles), poly (anilines), poly (thiophenes), poly (-p-phenylene vinylenes), poly (3-alkyl thiophenes), poly (3-alkyl furans), poly (3-alkylselenophene), poly (9-alkyl fluorenes), poly (2,5-dialkoxy-p-phenylene vinylenes) and the like. These polymers can be synthesized by conventional chemical methods using catalyst such as $FeCl_3$ or by conventional electrochemical methods.

The solvent, preferably a polar solvent, used to solubilize the conducting polymers, if not in the liquid state already, can include water, dioxane, tetrahydrofuran (THF), ethanol, methanol, isopropanol, butyl alcohol, ethyl acetate, butyl acetate, acetonitrile, 2-ethyl-1-hexanol, glycerol, acetic acid, butyric acid, butyrulactone, ethylene carbonate, butyl phosphate, 2-pyrrolidinone, ethyl acetoacetate, dimethyl sulfoxide (DMSO), tetramethylene sulfone and the like. These conducting liquid polymers solutions can also optionally include conductive particles as previously described.

The conducting polymers which are solubilized are typically provided in the solution at a concentration of about 5 to 80% (by weight), preferably about 30 to 60% (by weight), and most preferably at as high a concentration as possible to effectively provide the desired electrical conductance without crystallization out of the solution.

The conductive liquid compositions can also be made from liquid metals, for example, mercury. Other types of conductive liquids can further be used as will become apparent from the examples above or from the practice of the invention. The conductive liquid compositions can even further be a combination of any of the conductive liquid compositions described above.

The conductive liquid, thus formed, preferably has a normal resistance of about 0.1 to 400 Ω, preferably about 0.1 to 10 Ω.

When the conductive liquid compositions are used as a current carrying component in an electrical circuit protection device according to the invention, the conductive liquid composition is contained or encapsulated within an elongated flexible and resilient capsule with electrodes on both ends. The flexible capsule can be made of an elastomeric composition, such as latex, silicone, ethylene polypropylene (EPR), polyvinyl chloride (PVC), styrene butadiene (SBR) and the like. Any appropriate known elastomeric material can be used for the flexible capsule. The flexible capsule containing the conductive fluid is generally elongated along the direction of current flow and includes two electrodes at the ends thereof which are electrically connected to the internally contained conductive liquid and which are connectable to a source of electrical power to cause current to pass through the conductive liquid.

The encapsulated conductive liquid is provided to act as a good conductor under normal steady-state operations but when a fault occurs, the encapsulated conductive liquid provides a resistance increase by order of magnitude as a result of deformation of the capsule, i.e., radial contraction and axial expansion, by an electromechanical actuator, such as a solenoid and plunger combination, activated by the magnitude of the current above a certain value, herein referred to as the fault current value. The flexible capsule can be an elongated hollow shell or tube of generally cylindrical shape and having closed walls sealed by electrodes. The capsule is sized to permit enclosure of the conductive liquid and has sufficient flexibility to allow contraction without breakage.

Referring now to FIG. 1 of the drawings, an electrical circuit protection device 1 containing conductive liquid compositions in accordance with the present invention is shown. The device 1 includes a flexible hollow shell or flexible capsule 10, e.g., an elastomeric capsule, elongated along a length in the general direction of current flow and preferably of a generally cylindrical shape having an unconstricted diameter shown as $d_{ON}$. The capsule 10 is preferably sealed at both ends by electrodes 12 and 14, e.g., metal electrodes, such as copper, nickel, aluminum, silver, platinum, tungsten, and the like or alloys thereof, and electrically connected by terminal wires 16 and 18 to a load 20 and an electrical power source (not shown). A conductive liquid 22, for example, a conductive particle suspension as previously described is shown which comprises a liquid suspension medium 24 and conductive particles 26 dispersed therein and is contained within the capsule 10 and fills the interior of the capsule. The conductive liquid 22 is preferably a colloidal, non-flocculating, suspension of conductive particles in a dielectric liquid suspension medium. Other conductive liquid compositions as previously described can also be used. The conductive liquid 22 is electrically connected to the electrodes 12 and 14 by being in intimate contact with the electrodes.

The encapsulated conductive liquid comprising the flexible capsule 10, the two electrodes 12 and 14 closing the ends of the capsule, and the conductive liquid composition 22 contained within the capsule and in contact with the electrodes, can be provided as an interchangeable module. Accordingly, after numerous fault cycles and exhaustion of its current limiting capability, the exhausted module can easily be replaced with a fresh module.

An actuator 28 for producing mechanical force is electrically attached by terminal wires 30 and 32 to an electrode and the load and contains a load sensing element which senses a fault current. The actuator 28 preferably comprises a solenoid 34 connected to a plunger 36 having two opposed faces 38 and 40 which are positioned on opposite sides of the elongated capsule 10 containing the conductive liquid 22 and transverse to its length in the direction of current flow. The solenoid 34 is used to sense a fault current and actuate a means for deformation of the conductive path, i.e. , constriction transverse to the current path and/or expansion along the current path. The plunger 36 is preferably used as the means for deformation of the flexible capsule 10 transverse to the direction of the current flow in the conductive liquid, i.e., transverse contraction and axial expansion, when activated by the detected fault current. It is possible to use other commonly known electromechanical actuator means for sensing a fault current and for deforming the conductive path through the flexibly contained conductive liquid composition between the electrodes to increase resistance.

A shunt resistor 42, such as a metal rod or wire of nichrome, iron, nickel, and the like, is preferably electrically connected to electrodes 12 and 14 and is provided in series with the conductive liquid 22. The shunt resistor is a low inductance resistor capable of absorbing high energies and should have a resistance of about 0.1 to 0.5 Ω or greater depending on the application and on the conductive liquid's ability to commutate the current to the resistor when the conductive liquid is in a state of high resistance. A switch or auxiallary contacts 2 may be connected to the electrodes and the resistor (FIG. 5) to remove residual current from the conductive liquid and the shunt resistor.

A housing (not shown) of electrical insulation material can be provided to contain the circuit protection device 1.

FIG. 1 shows a current $I_{steady-state}$ flowing across the load circuit in its steady-state normal current operating conditions which flows across the conductive liquid 22 in a low resistance state, typically having a resistance of about 1 to 100 mΩ, preferably about 2 to 20 mΩ. No current flows across the shunt resistor 42 during steady-state operations. FIG. 1 also shows that the actuator 28 is inactive and the plunger faces 38 and 40 are opened and the capsule has an unconstricted diameter $d_{ON}$.

Figure 2:
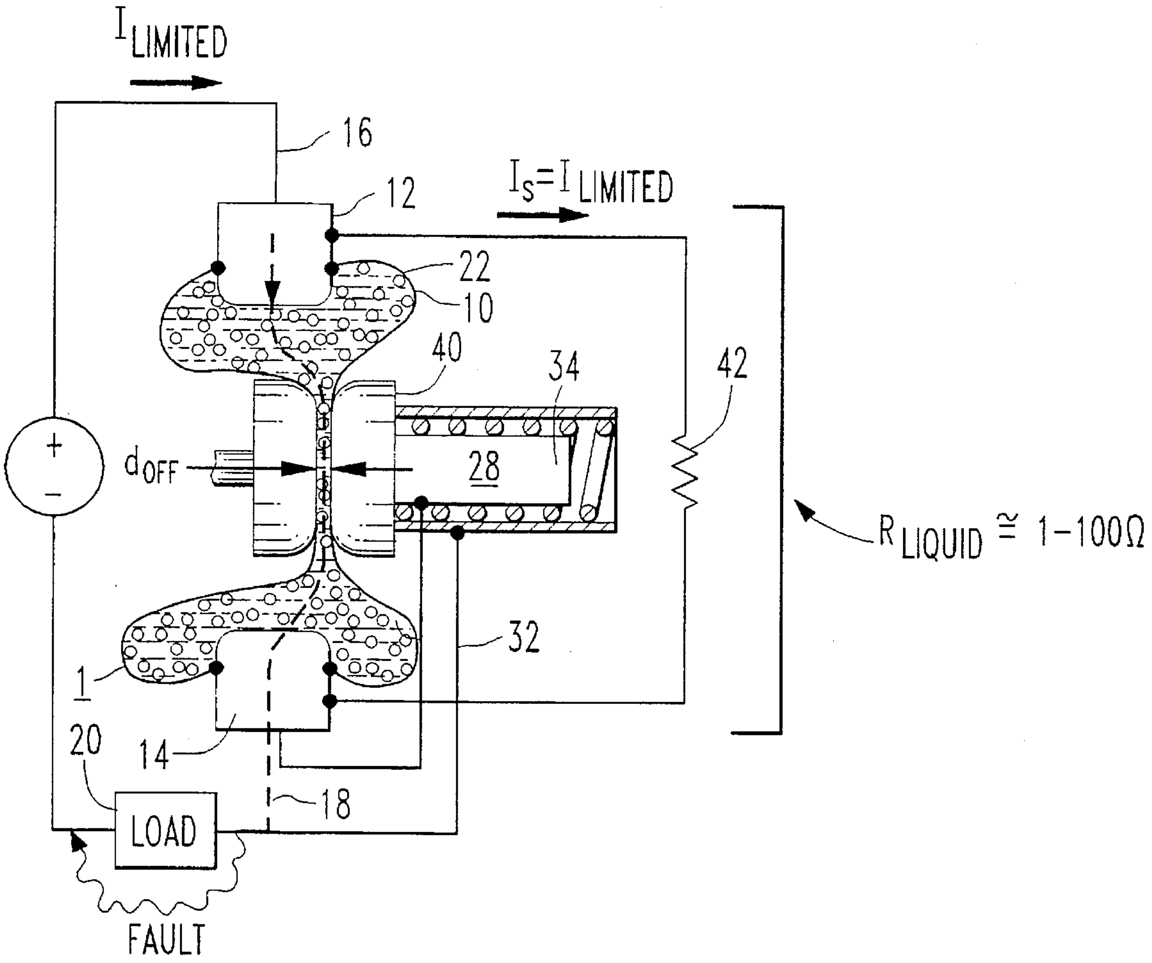
FIG. 2 is an illustration of an electrical circuit including an electrical power source, a load, and a solenoid, and further comprising a circuit protection device of the invention comprising conductive liquid compositions of the invention carrying an excessive current under fault conditions.

Referring now to FIG. 2 of the drawings, a fault current condition, i.e. , due to overload or short circuit, is rapidly sensed by the solenoid 34 (e.g., in about less than 1 millisecond) which is then energized to pull the opposed plunger faces 38 and 40 together which constricts the diameter of the capsule 10 transverse to the direction of current flow having a diameter $d_{OFF}$ and, consequently, rapidly constricts the conductive path in the conductive liquid 22 enclosed therein. The activated plunger causes distortion of the capsule, i.e., radial contraction and axial expansion, which greatly reduces the cross-sectional area of the conductive liquid 22 and current path, thereby greatly increasing its resistance to a high resistance state of about 0.1 to 1000 Ω, preferably about 1 to 100 Ω. The solenoid 34 and plunger 36 are a fast acting actuator combination which rapidly causes a reduction of the let through current through the conductive liquid composition, and consequently, a reduction in any excessive resistive heating of the liquid, during fault conditions which avoids not only damage to the electrical circuit components, but also damage to the conductive liquid composition.

In the now formed high resistance state of the current path through the conductive liquid between the electrodes as a result of rapid radial compression of the capsule containing the conductive liquid, the let through current is limited to a safe value until the excessive current or fault current is removed. It is preferred that once the state of high resistance is formed, the fault current is commutated to a shunt resistor 42 to limit the let through current to a safe valve and also limit the voltage rise and resistive heating across the conductive liquid to avoid electrical breakdown across the liquid conductors during switching. Once the excessive current is removed, the opposed plunger combination faces 38 and 40 are released and the capsule 10 and conductive liquid 22 revert back to a state of low resistance for normal steady-state current conduction.

While not wishing to be bound by theory, it is believed that the basis for the resistance change in the conductive liquid, can be estimated from the following equations:

$$R=\rho l/A \quad (1)$$

where R is resistance, ρ is resistivity of the conductive liquid, l is conductor length, and A is the cross-sectional area of the encapsulated conductive liquid. The approximate cross-sectional areas for an effective circuit protection or current limiter device comprising conductive liquids can be determined using the following ratio derived from Equation (1):

$$R_{on}/R_{off}=l_{on}A_{off}/l_{off}A_{on} \quad (2)$$

Assuming a cylindrical geometry of the capsule with $l_{on}=l_{off}$, equal resistivity for the on condition and off condition, and $A_{off}/A_{on}=(r_{off}/r_{on})^2$, where r is the radius of the cylinder, $r_{off}$ is the constricted radius and $r_{on}$ is the unconstricted radius, then Equation (2) can be rewritten as:

$$R_{on}/R_{off}=(r_{off}/r_{on})^2 \quad (3)$$

and the resistivity of the conductive liquid can be written as:

$$\rho=R_{on}A_{on}/l_{on} \quad (4)$$

Using these equations, Table 1 below shows the calculated resulting constriction radius ($r_{off}$) over a range of off resistance values ($R_{off}$) for two typical on resistance values ($R_{on}$). Power dissipated is the route mean square (rms) off current×440 $V_{rms}$ using a 440 V AC circuit as an example.

TABLE 1

| Resistance On (mΩ) | Radius On (cm) | Resistivity ($l_{on}$–5 cm) (Ω-cm) | Resistance Off (Ω) | Radius Off (mm) | Power Dissipated (kW) |
|---|---|---|---|---|---|
| 10 | 0.5 | $1.6 \times 10^{-3}$ | 0.1 | 1.6 | 1936.0 |
| 10 | 0.5 | | 1.0 | 0.5 | 194.0 |
| 10 | 0.5 | | 10.0 | 0.16 | 19.4 |
| 10 | 0.5 | | 100.0 | 0.05 | 1.9 |
| 10 | 0.5 | | 1000.0 | 0.016 | 0.19 |
| 10 | 0.5 | | 10000.0 | 0.005 | 0.019 |
| 50 | 0.5 | $7.9 \times 10^{-3}$ | 0.1 | 3.54 | 1936.0 |
| 50 | 0.5 | | 1.0 | 1.12 | 194.0 |
| 50 | 0.5 | | 10.0 | 0.35 | 19.4 |
| 50 | 0.5 | | 100.0 | 0.11 | 1.9 |
| 50 | 0.5 | | 1000.0 | 0.035 | 0.19 |
| 50 | 0.5 | | 10000.0 | 0.011 | 0.019 |

Figure 3:
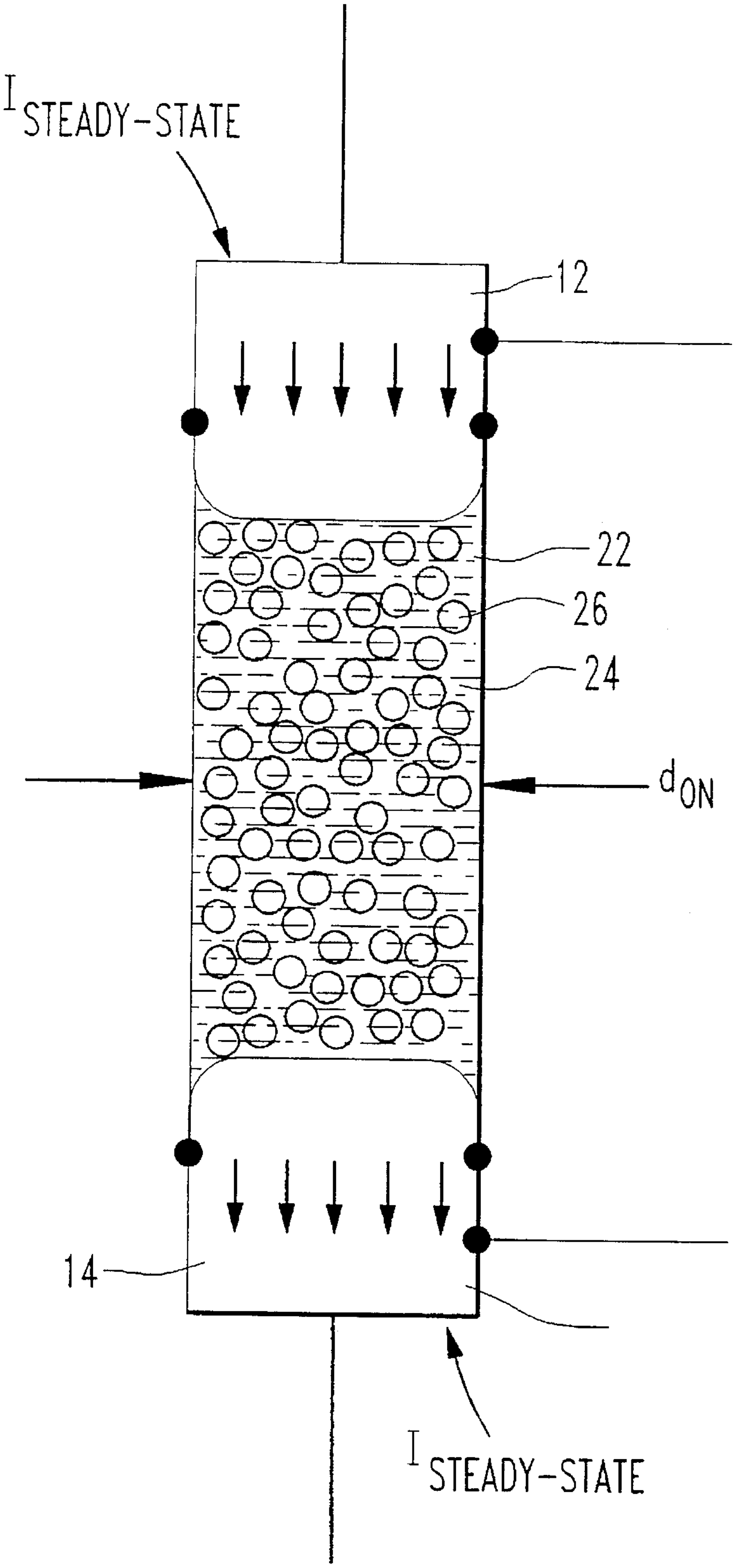
FIG. 3 is an illustration of conductive liquid compositions of the invention in a low resistance state.
Figure 4:
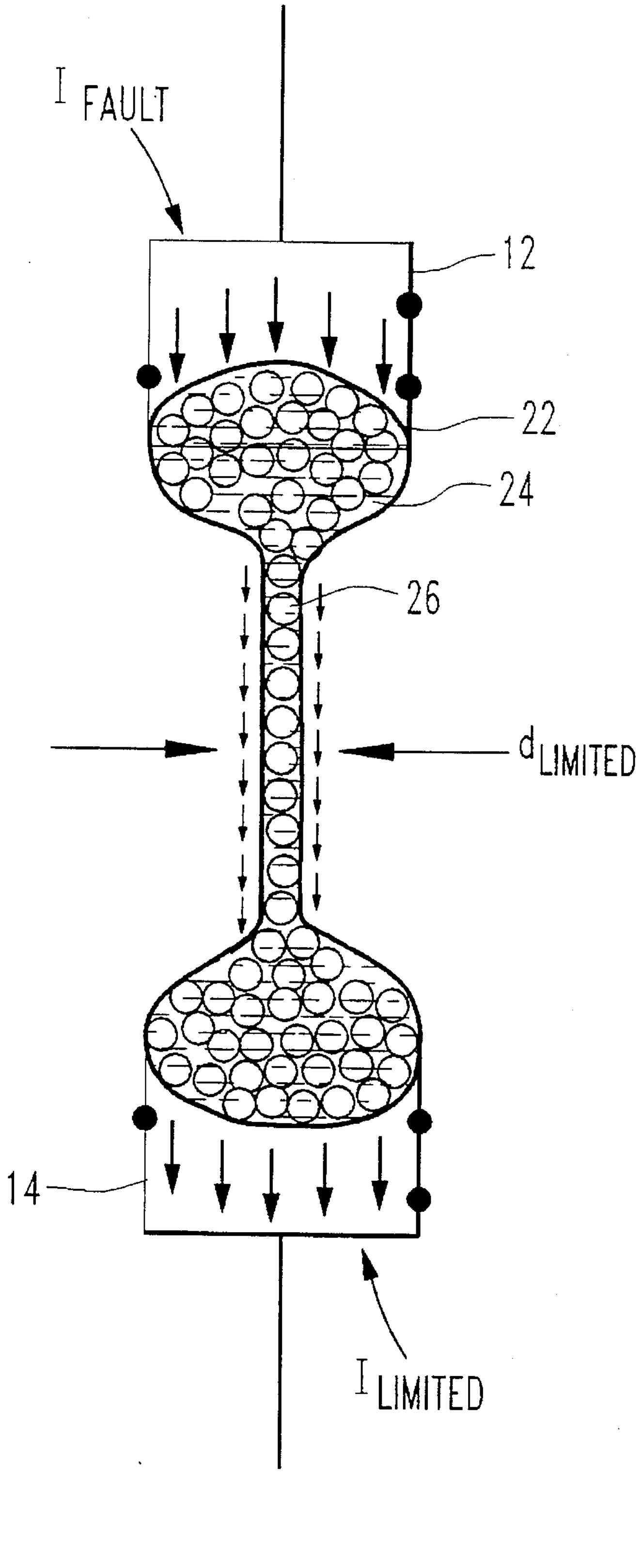
FIG. 4 is an illustration of conductive liquid compositions of the invention in a high resistance state; and, FIG. 5 including FIGS. *5a*, *5b* and *5c*, is an illustration of an application of the current limiting device of the invention in a conventional circuit breaker device.

Some factors which need to be considered when designing the circuit protection device comprising conductive liquid compositions of the invention are: (a) required constriction radius ($r_{off}$) of the flexible capsule 10, e.g., cylindrical and elastomeric, which effectively reduces the cross-sectional area of the conductive liquid compositions to create high resistance in the liquid and minimize the let through current; (b) plunger velocity, which determines the reaction time of the trip caused by a fault current and also prevents vaporization of the liquid from excessive resistive heating ($I^2R$) and, consequently, prevents destruction of the current limiter during switching processes; and (c) conductive liquid composition, i.e., resistivity, viscosity, conductive particle size, conductive particle shape, stability, etc. It is desirable to maximize the off resistance by minimizing the constriction radius which would minimize the power dissipated in the conducting liquid. Referring now to FIGS. 3 and 4, these drawings diagrammatically illustrate the encapsulated conductive liquids in a low resistance and high resistance state, respectively. In the high resistance state, current is constricted to flow through the conductive particle surface in the constricted diameter of the conductive liquid which increases resistance by reducing the cross-sectional area of the liquid and conductive path.

Figure 5A:
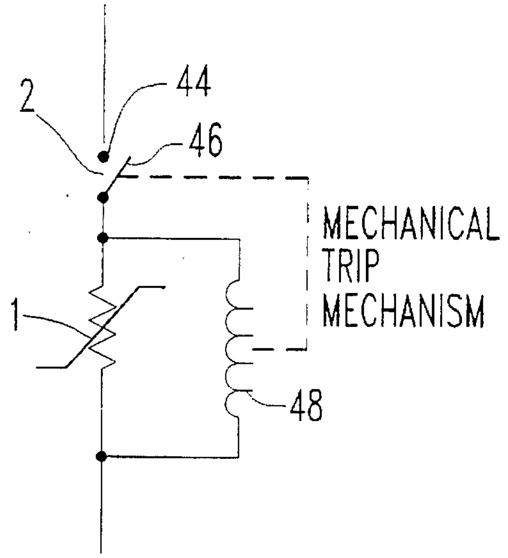
Figure 5B:
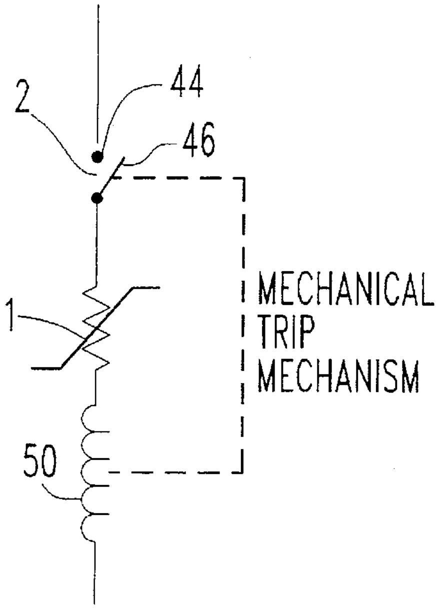
Figure 5C:
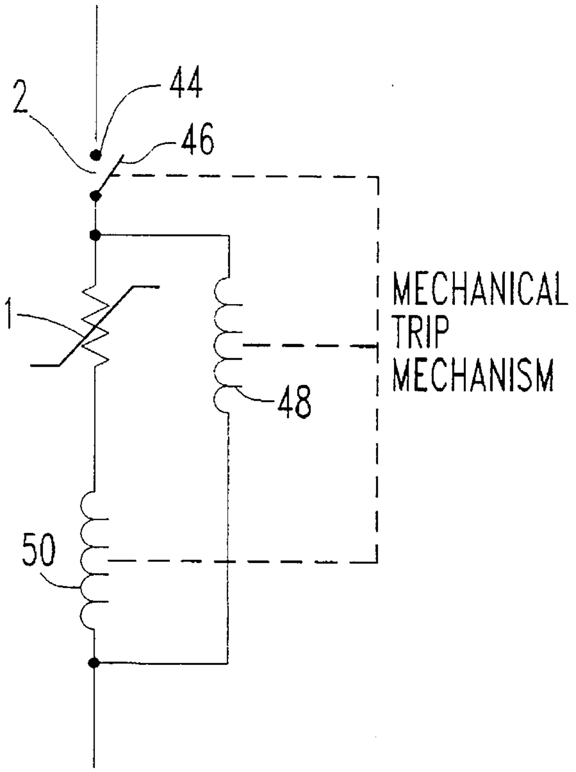

Referring now to FIG. 5 including FIGS. 5*a*, 5*b* and 5*c*, these figures diagrammatically show the current limiting device 1 of the invention applied in a conventional circuit breaker 2 including contacts 44 and 46 to create or enhance the current limiting capability of the circuit breaker. As shown in FIG. 5*a*, a high impedance coil 48 can be placed in parallel with the circuit protection device 1 to trip the breaker contacts 44 and 46. As shown in FIG. 5*b*, a low impedance coil 50 can be placed in series with the circuit protection device 1 to also trip the breaker contacts 44 and 46. As shown in FIG. 5*c*, a combination of the arrangements of FIGS. 5*a* and 5*b* can be used which include both the high impedance coil 48 in parallel and the low impedance coil 50 in series with the circuit protection device 1 to trip the breaker contacts 44 and 46.

The invention will further be clarified by a consideration of the following Example which is intended to be purely exemplary of conductive liquid compositions of the invention and the low resistivity thereof. Other embodiments of the invention will be apparent from a consideration of this disclosure or from the practice of the invention.

EXAMPLE 1

Electrical Resistance of Conductive Liquid Compositions

Conductive liquid compositions were prepared and tested to determine the resistance of the conductive liquid compositions at full circuit voltage (38 $V_{o-p}$) of 60 Hz. Many of the conductive liquid compositions including dielectric liquids and conductive metal particles did not conduct until the voltage was above 30 $V_{o-p}$. It appeared that the liquid dielectric coated the copper electrodes and had to be broken down or the dielectric surrounded conductive metal particles had to be broken down before conduction occurred. However, once the barrier was broken down, i.e., conditioning the liquid, the liquid remained conductive even at much lower voltages of about 10 $V_{o-p}$. The ionic liquids did not require preconditioning. The ionic liquids tested also included conductive metal particles in the test. The electrical properties of conducting polymer solutions were tested in Yoshino, *Novel Electrical and Optical Properties of Liquid Conducting Polymers and Oligomers*, IEEE Trans. on Dielec. and Elec. Ins., Vol. 1, No. 3, pp. 353–364, June 1994, previously incorporated by reference herein in its entirety.

The conductive liquids were tested for current flow in a test cell made of a annular elongated outer copper electrode having an annular space for the conductive liquid composition to be tested, the annular space having an opening on one end and sealed on the other end by a micarta plug. The test cell further comprised an elongated center copper electrode of a smaller diameter than the annular space which is placed in the opening of the annular space and either passing through the micarta plug or part way through the annular space. The resistance values for the conductive liquid compositions tested are listed in Table 2 below and were measured with 60 Hz AC currents ranging from 15–20 $A_{rms}$.

TABLE 2

| Sample (No.) | Conducting Particles | Particle Shape | Particle (% wt) | Particle (% vol) | Fluid Type | Vacuum Outgassed | Resistance (mΩ) |
|---|---|---|---|---|---|---|---|
| 1 | Nickel | A-10 Fiber | 63 | 16* | Silicone | No | 0.65 |
| 2 | Nickel | Spheres | 19 | | Silicone | No | 2.9 |
| 3 | #1 + 10% | 235 Silver Flake | | 16/2.2* | Silicone | No | 0.71 |
| 4 | Aluminum | K-105 Flake | 57 | 30* | Mineral | No | 170 |
| 5 | Aluminum | K-107 Flake | 46 | 21* | Mineral | No | 35 |
| 6 | Silver | 134 Flake | 71 | 17* | Mineral | No | 25.0 |
| 7 | Nickel | A-10 Fiber | 56 | 16* | Ionic 1 | No | 309 |
| 8 | Nickel | A-10 Fiber | 63 | 17* | Mineral | Yes | 259 |
| 9 | Nickel | A-10 Fiber(41 g) | | | Ionic 2 | No | 400 |

*Balance of weight volume percent is fluid.
Mineral : Mineral Oil (Transformer Grade)
Silicone : Dow-Corning 550 Fluid
Ionic 1 : 25 ml Tetramethylene Sulfone + 0.86 g $NaBPh_4$
Ionic 4 : 25 ml Tetramethylene Sulfone + 3.80 g $LiPF_6$ The invention having been disclosed in connection with the foregoing variations and examples, additional variations will now be apparent to persons skilled in the art. The invention is not intended to be limited to the variations specifically mentioned, and accordingly reference should be made to the appended claims rather than the foregoing discussion, to assess the spirit and scope of the invention in which exclusive rights are claimed.

We claim:

1. An electrically conductive liquid device for electrical circuit protection, which comprises:

(a) an elongated flexible and resilient elastomeric capsule having two ends and an electrode on each of the ends; and, (b) an effective amount of a conductive liquid composition contained within the elastomeric capsule and electrically connected to each of the electrodes, in which the electrically conductive liquid exhibits a switching from conductivity to resistivity when subject to an effective amount of constriction of the elastomeric capsule transverse to the direction of the flow of an electrical current applied to the conductive liquid contained within the elastomeric capsule through the electrodes.

2. The electrically conductive liquid device of claim 1, in which the elastomeric material is selected from the group of elastomers consisting of latexes, silicones, ethylene polypropylenes, polyvinyl chlorides, and styrene butadienes.

3. The electrically conductive liquid device of claim 1, in which the conductive liquid composition is selected from the group consisting of conductive particle dispersions, conductive ionic solutions, conductive polymer solutions, and conductive liquid metals.

4. The electrically conductive liquid device of claim 3, in which the conductive liquid composition comprises a conductive particle dispersion which comprises:

(a) a dielectric fluid; and, (b) a plurality of conductive particles dispersed in the dielectric fluid.

5. The electrically conductive liquid device of claim 4, in which the conductive particles are selected from the group consisting of carbon black, graphite, metal, metal oxide, and metal coated particles.

6. The electrically conductive liquid device of claim 4, in which the dielectric fluid is selected from the group consisting of silicone oil, hydrocarbon oil, mineral oil, transformer oil, and ester oil.

7. The electrically conductive liquid device of claim 4, in which the conductive particles are loaded in the dielectric fluid in a concentration of about 10 to 40% by volume based on the total volume of the conductive particle dispersion.

8. The electrically conductive liquid device of claim 4, in which the conductive particle dispersion is a colloidal suspension of the conductive particles.

9. The electrically conductive liquid device of claim 3, in which the conductive liquid composition comprises a conductive ionic solution which comprises:

(a) a solvent; and, (b) an organometallic salt dissociated in the solvent.

10. The electrically conductive liquid device of claim 9, in which the solvent comprises a polar solvent selected from the group consisting of water, dioxane, tetrahydrofuran, ethanol, methanol, isopropanol, butyl alcohol, ethyl acetate, butyl acetate, acetonitrile, 2-ethyl-1-hexanol, glycerol, acetic acid, butyric acid, butyrulactone, ethylene carbonate, butyl phosphate, 2-pyrrolidinone, ethyl acetoacetate, dimethyl sulfoxide, and tetramethylene sulfone.

11. The electrically conductive liquid device of claim 9, in which the organometallic salt is selected from the group consisting of tetraphenyl phosphonium chloride, tetraphenyl phosphonium bromide, tetrabutyl arsonium chloride, triphenylbutyl arsonium iodide, methyltrioctyl phosphonium dimethylphosphate, tetrabutyl phosphonium acetate, tetraphenyl arsonium acetate, tetrabutyl ammonium chloride, benzylmethyl ammonium iodide, tetraphenyl stibonium bromide, tetraphenyl sodium boride, and hexafluoro lithium phosphate.

12. The electrically conductive liquid device of claim 9, in which the salt is provided in a concentration of about 2 to 70% (by weight).

13. The electrically conductive liquid device of claim 3, in which the conductive liquid composition comprises a conductive polymer solution which comprises:

(a) a solvent; and, (b) a conducting polymer or oligomer dissolved in the solvent.

14. The electrically conductive liquid device of claim 13, in which the solvent comprises a polar solvent and is selected from the group consisting of water, dioxane, tetrahydrofuran, ethanol, methanol, isopropanol, butyl alcohol, ethyl acetate, butyl acetate, acetonitrile, 2-ethyl-1-hexanol, glycerol, acetic acid, butyric acid, butyrulactone, ethylene carbonate, butyl phosphate, 2-pyrrolidinone, ethyl acetoacetate, dimethyl sulfoxide, and tetramethylene sulfone.

15. The electrically conductive liquid device of claim 13, in which the conducting polymer or oligomer is selected from the group consisting of poly (pyrroles), poly (anilines), poly (thiophenes), poly (-p-phenylene vinylenes), poly (3-alkyl thiophenes), poly (3-alkyl furans), poly (3-alkylselenophenes), poly (9-alkyl fluorenes), and poly (2,5-dialkoxy-p-phenylene vinylenes).

16. The electrically conductive liquid device of claim 13 in which the conducting polymer or oligomer is provided in a concentration of about 5 to 80% (by weight).

17. The electrically conductive liquid device of claim 3, in which the conductive liquid composition comprises a liquid metal.

18. The electrically conductive liquid device of claim 17, in which the liquid metal comprises liquid mercury.

19. An electrical circuit protection device, which comprises:

(a) an elongated flexible and resilient capsule having a length and two ends;

(b) an effective amount of a conductive liquid composition contained within the flexible capsule between the two ends which exhibits a switching from conductivity to resistivity when subject to an effective amount of constriction transverse to the length of the flexible capsule and to the direction of an electrical current applied to the conductive liquid;

(c) two electrodes sealing the two ends of the flexible capsule and electrically connected to the conductive liquid composition and electrically connectable to a source of electrical power to cause a current to pass through the conductive liquid composition;

(d) a shunt resistor electrically connected to the electrodes; and, (e) an actuator electrically connected to the electrodes and mechanically connected to the capsule, in which the actuator when subject to fault current distorts the capsule by transverse axial constriction and axial expansion to cause a switching of the conductive liquid from conductivity to resistivity and a commutating of the current to the shunt resistor to limit the let through current to an effectively safe value.

20. The electrical circuit protection device of claim 19, in which the actuator comprises a solenoid electrically connected to the electrodes and a plunger having two spaced apart opposed faces with the capsule positioned between the opposed faces for constriction transverse to the length of the capsule.

21. The electrical circuit protection device of claim 19, which further comprises a circuit breaker electrically connected with the device.

22. The electrical circuit protection device of claim 19, in which the flexible capsule is generally cylindrical in shape.

23. The electrical circuit protection device of claim 19; in which the conductive liquid composition is selected from the group consisting of conductive particle dispersions, conductive ionic solutions, conductive polymer solutions, and conductive liquid metals.

24. The electrical circuit protection device of claim 23, in which the conductive liquid composition comprises a conductive particle dispersion which comprises:

(a) a dielectric fluid selected from the group consisting of silicone oil, hydrocarbon oil, mineral oil, transformer oil, and ester oil; and, (b) a plurality of conductive particles selected from the group consisting of carbon black, graphite, metal, metal oxide, and metal coated particles, dispersed in the dielectric fluid.

25. The electrical circuit protection device of claim 23, in which the conductive liquid composition comprises a conductive ionic solution which comprises:

(a) a polar solvent selected from the group consisting of water, dioxane, tetrahydrofuran, ethanol, methanol, isopropanol, butyl alcohol, ethyl acetate, butyl acetate, acetonitrile, 2-ethyl-1-hexanol, glycerol, acetic acid, butyric acid, butyrulactone, ethylene carbonate, butyl phosphate, 2-pyrrolidinone, ethyl acetoacetate, dimethyl sulfoxide, and tetramethylene sulfone; and, (b) an organometallic salt selected from the group consisting of tetraphenyl phosphonium chloride, tetraphenyl phosphonium bromide, tetrabutyl arsonium chloride, triphenylbutyl arsonium iodide, methyltrioctyl phosphonium dimethylphosphate, tetrabutyl phosphonium acetate, tetraphenyl arsonium acetate, tetrabutyl ammonium chloride, benzylmethyl ammonium iodide, tetraphenyl stibonium bromide, tetraphenyl sodium boride, and hexafluoro lithium phosphate, dissociated in the solvent.

26. The electrical circuit protection device of claim 23, in which the conductive liquid composition comprises a conductive polymer solution which comprises:

(a) a polar solvent selected from the group consisting of water, dioxane, tetrahydrofuran, ethanol, methanol, isopropanol, butyl alcohol, ethyl acetate, butyl acetate, acetonitrile, 2-ethyl-1-hexanol, glycerol, acetic acid, butyric acid, butyrulactone, ethylene carbonate, butyl phosphate, 2-pyrrolidinone, ethyl acetoacetate, dimethyl sulfoxide, and tetramethylene sulfone; and, (b) a conducting polymer or oligomer selected from the group consisting of poly (pyrroles), poly (anilines), poly (thiophenes), poly (-p-phenylene vinylenes), poly (3-alkyl thiophenes), poly (3-alkyl furam), poly (3-alkylselenophenes), poly (9-alkyl fluorenes), and poly (2,5-dialkoxy-p-phenylene vinylenes), dissolved in the solvent.

27. The electrical circuit protection device of claim 23, in which the conductive liquid composition comprises a conductive liquid metal which comprises mercury.

28. An electrical circuit, which comprises:

(a) a power source having a voltage;

(b) an electrical load connected to the power source;

(c) a circuit protection device connected to the electrical load which comprises:

(i) an elongated flexible and resilient capsule having a length and two ends;

(ii) an effective amount of a conductive liquid composition contained within the flexible capsule between the two ends which exhibits a switching from conductivity to resistivity when subject to an effective amount of constriction transverse to the length of the flexible capsule and to the direction of an electrical current applied to the conductive liquid;

(iii) two electrodes sealing the two ends of the flexible capsule and electrically connected to the conductive liquid composition and electrically connectable to a source of electrical power to cause a current to pass through the conductive liquid composition;

(iv) a shunt resistor electrically connected to the electrodes; and, (v) an actuator electrically connected to the electrodes and mechanically connected to the capsule, in which the actuator when subject to fault current distorts the capsule by transverse axial constriction and axial expansion to cause a switching of the conductive liquid from conductivity to resistivity and a commutating of the current to the shunt resistor to limit the let through current to an effectively safe value.

29. The electrical circuit of claim 28, in which the circuit is liable to faults of a voltage 600 volts or lower.

30. The electrical circuit of claim 28, in which the circuit further comprises a circuit breaker electrically connected to the device.

31. The electrical circuit of claim 28, in which the shunt resistor is electrically connected to the electrodes through a commutator.

* * * * *